United States Patent
McCombs

(10) Patent No.: US 10,861,513 B2
(45) Date of Patent: Dec. 8, 2020

(54) MEMORY DEVICE WITH SELECTIVE PRECHARGING

(71) Applicant: Taiwan Semiconductor Manufacturing Company, Ltd., Hsinchu (TW)

(72) Inventor: Ed McCombs, Hsinchu (TW)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 16/523,592

(22) Filed: Jul. 26, 2019

(65) Prior Publication Data

US 2020/0135245 A1    Apr. 30, 2020

Related U.S. Application Data

(60) Provisional application No. 62/753,770, filed on Oct. 31, 2018.

(51) Int. Cl.
| | | |
|---|---|---|
| *G11C 7/12* | (2006.01) | |
| *G11C 8/08* | (2006.01) | |
| *G11C 11/419* | (2006.01) | |
| *G11C 11/418* | (2006.01) | |
| *G11C 5/14* | (2006.01) | |

(52) U.S. Cl.
CPC ............. *G11C 7/12* (2013.01); *G11C 5/147* (2013.01); *G11C 8/08* (2013.01); *G11C 11/418* (2013.01); *G11C 11/419* (2013.01)

(58) Field of Classification Search
CPC .......... G11C 7/12; G11C 8/08; G11C 11/419; G11C 11/418; G11C 5/147
USPC ........................................................ 365/203
See application file for complete search history.

(56) References Cited

U.S. PATENT DOCUMENTS

| | | | |
|---|---|---|---|
| 9,922,699 B1 * | 3/2018 | Sinangil | G11C 11/417 |
| 2008/0056021 A1 | 3/2008 | Kobayashi | |
| 2010/0142245 A1 | 6/2010 | Kitagawa | |
| 2014/0136764 A1 * | 5/2014 | Li | G11C 16/22 711/103 |
| 2016/0027495 A1 | 1/2016 | Kim et al. | |
| 2017/0168636 A1 * | 6/2017 | Xi | G06F 3/0416 |
| 2018/0151234 A1 * | 5/2018 | Cho | G11C 16/3427 |
| 2020/0105321 A1 * | 4/2020 | Sinangil | G11C 7/12 |

FOREIGN PATENT DOCUMENTS

| | | |
|---|---|---|
| JP | 2008-59653 A | 3/2008 |
| JP | 2010-140526 A | 6/2010 |
| KR | 10-2007-0002693 A | 1/2007 |

\* cited by examiner

*Primary Examiner* — Fernando Hidalgo
(74) *Attorney, Agent, or Firm* — Merchant & Gould P.C.

(57) ABSTRACT

A memory device includes memory cells operably connected to column signal lines and to word signal lines. The column signal lines associated with one or more memory cells to be accessed (e.g., read) are precharged to a first voltage level. The column signal lines not associated with the one or more memory cells to be accessed are precharged to a second voltage level, where the second voltage level is less than the first voltage level.

20 Claims, 10 Drawing Sheets

MEMORY DEVICE WITH SELECTIVE PRECHARGING

CROSS-REFERENCE TO RELATED APPLICATION(S)

This application claims priority to U.S. Provisional Application No. 62/753,770 entitled "Memory Device with Precharge Circuit," filed on Oct. 31, 2018, of which the entire disclosure is hereby incorporated by reference in its entirety

BACKGROUND

Different types of memory circuits are used in electronic devices for various purposes. Read only memory (ROM) and random access memory (RAM) are two such types of memory circuits. A ROM circuit permits data to be read from, but not written to, the ROM circuit and retains its stored data when power is switched off. As such, a ROM circuit is typically used to store programs that are executed when the electronic device is turned on.

A RAM circuit allows data to be written to, and read from, selected memory cells in the RAM circuit. One type of a RAM circuit is a static random access memory (SRAM) circuit. A typical SRAM circuit includes an array of addressable memory cells arranged in columns and rows. When a memory cell is to be read, the memory cell is selected by activating both a row word line and the column signal lines (bl and blb lines) connected to the memory cell. However, the column signal lines can be relatively long and have large parasitic capacitances. In some instances, the parasitic capacitance can produce an erroneous read operation where an incorrect value (e.g., 1 or 0) is read from the memory cell.

To reduce the effects of the parasitic capacitances during a read operation, the column signal lines (bl and blb) can be precharged to a reference voltage (e.g., VDD) before the word line is asserted. After the column signal lines are precharged and the word line is activated, a voltage difference between the bl and blb lines is created. This voltage difference is used to determine whether a 1 or a 0 is stored in the memory cell.

In some devices, the power source used to precharge the column signal lines is a rechargeable power source, such as a battery. When all of the column signal lines are precharged at one time, some of the charge from the battery that is used to precharge the column signal lines is used unnecessarily because only a subset of the precharged column signal lines is selected when a memory cell is accessed. The charge that was used to precharge the unselected column signal lines is wasted.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
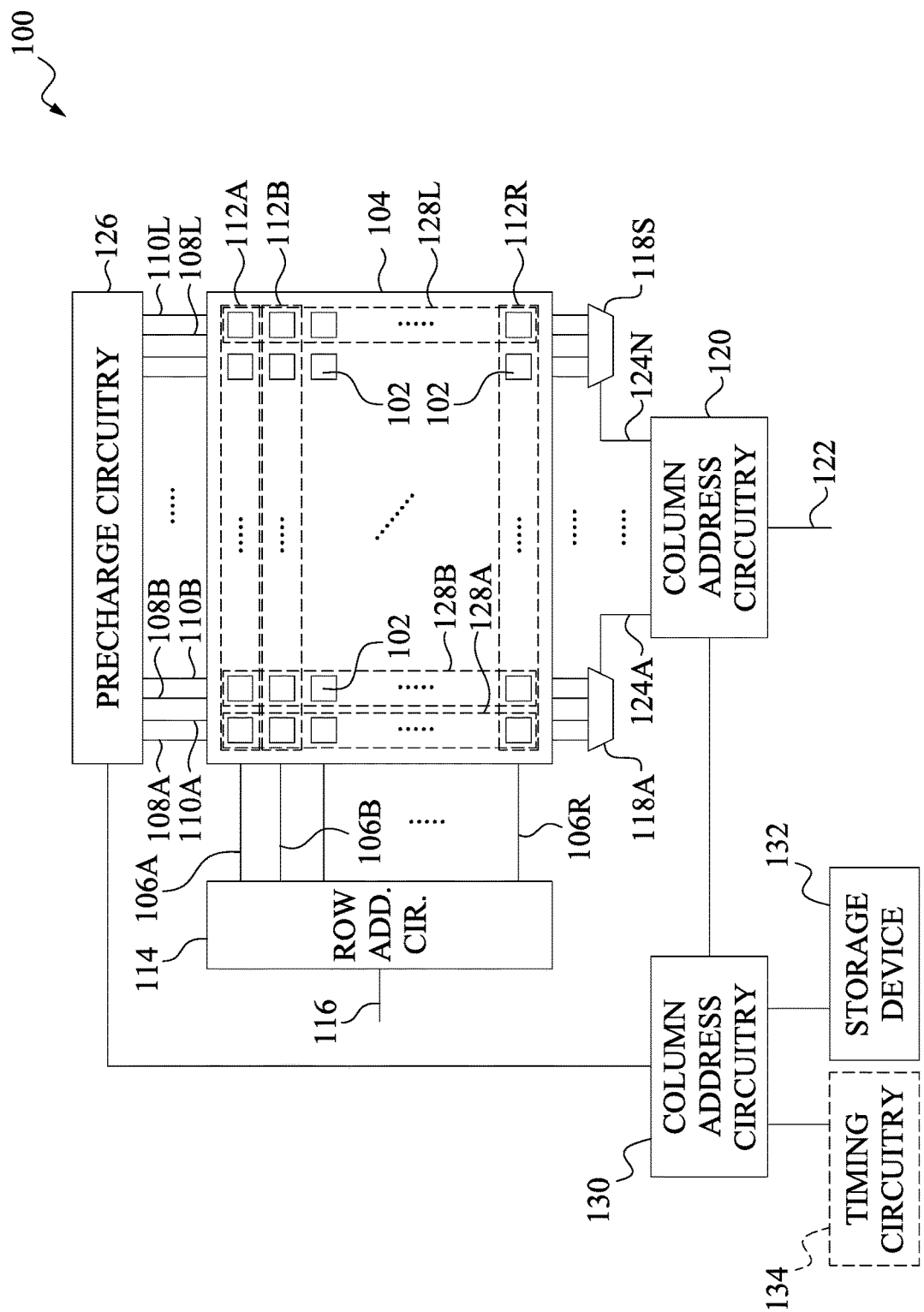
FIG. 1 illustrates a block diagram of a portion of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein provide various techniques for selectively precharging the column signal lines operably connected to memory cells to a first voltage level or a different second voltage level. The second voltage level is less than the first voltage level and greater than zero (e.g., ground). The column signal lines associated with one or more memory cells to be accessed (e.g., to be read) are precharged to the first voltage level. In one embodiment, the first voltage level is VDD. The column signal lines not associated with the one or more memory cells to be accessed are precharged to the second voltage level. In some embodiments, the second voltage level is a voltage that is less than the first voltage level and maintains the stability of the memory cells.

A memory device can consume less power or charge when only the selected column signal lines are precharged to the first voltage level and the unselected column signal lines are precharged to a voltage level lower that the first voltage level. For example, a memory device may consume less charge stored on a battery, which in turn can extend the amount of time between battery recharges.

FIG. 1 illustrates a block diagram of a portion of a memory device in accordance with some embodiments. In the illustrated embodiment, the memory device is a static random access memory (SRAM) device 100. Other embodiments are not limited to a SRAM device. The memory device can be any memory that precharges signal lines and selects only a subset of the precharged signal lines to perform an operation (e.g., access a memory cell or cells). Additionally, FIG. 1 is described in conjunction with accessing one memory cell in a memory array. In other embodiments, multiple memory cells may be accessed at one time.

The SRAM device 100 includes memory cells 102 that are arranged in rows and columns to form a memory array 104. A memory array 104 can include any suitable number of rows and columns. For example, a memory array may have R number of rows, where R is an integer greater than or equal to one, and L number of columns where L is a number greater than or equal to two.

In the illustrated embodiment, each memory cell 102 in a row 112A, 112B, . . . , 112R is operably connected to a row word line 106A, 106B, . . . , 106R (collectively referred to as a word line 106). Each memory cell 102 in a column 128A, 128B, . . . , 128L is operably connected to a column bit line (bl) 108A, 108B, . . . 108L, and a column bit line bar (blb) 110A, 110B, . . . , 110L (collectively referred to as bl line 108 and blb line 110). As will be described in more detail later, when a particular memory cell 102 is to be accessed (e.g., read), the bl and blb lines 108, 110 operably connected to that memory cell (the "selected memory cell") are precharged to a first voltage (e.g., VDD) and the bl and blb lines 108, 110 operably connected to the other memory cells (the "unselected memory cells") are precharged to a second voltage that is lower than the first voltage. Once all of the bl and blb lines 108, 110 are precharged, the word line 106 operably connected to the selected memory cell is activated and the memory cell is accessed (e.g., the value stored in the memory cell is read).

Each row 112A, 112B, . . . , 112R of memory cells 102 is operably connected to row address circuitry 114 via the word lines 106A, 106B, . . . , 106R. The row address circuitry 114 receives a row address on signal line 116 and activates the word line that corresponds to the row address. Although only one row address circuit is shown in FIG. 1, other embodiments can include multiple row address circuits with each row address circuit operably connected to a subset of the word lines. Thus, the row address circuitry 114 represents one or more row address circuits.

The column signal lines (bl and blb lines 108, 110) are grouped into subsets of column signal lines, and the subsets of column signal lines are operably connected to column select circuits 118A, . . . 118S, where S is a number greater than one (collectively referred to as column select circuit 118). One example of a column select circuit 118 is a multiplexer. Each column select circuit 118 is operably connected to column address circuitry 120. The column address circuitry 120 receives a column address on a signal line 122 and generates a select signal on a signal line 124A, 124N (collectively referred to as signal line 124) for a respective column select circuit 118. Although only one column address circuitry 120 is shown in FIG. 1, other embodiments can include multiple column address circuits.

The column signal lines (bl and blb lines 108, 110) in the memory array 104 are operably connected to precharge circuitry 126. The precharge circuitry 126 includes one or more precharge circuits, as will be discussed below. In one embodiment, each column 128A, 128B, . . . , 128L in the memory array 104 is operably connected to a precharge circuit. The precharge circuitry 126 charges the bl and blb lines 108, 110 to particular voltage levels. For example, for a read operation, the precharge circuitry 126 charges the selected column signal lines (selected bl and blb lines 108, 110) to a first voltage level and charges the unselected bl and blb lines 108, 110 to a lower second voltage level. Example techniques for precharging the column signal lines are described in more detail in conjunction with FIGS. 2-9.

One or more processing devices (represented by processing device 130) is operably connected to the row address circuitry 114, the column address circuitry 120, and the precharge circuitry 126. The processing device 130 can be any suitable type of processing device. In a non-limiting example, the processing device 130 may be a central processing unit, a microprocessor, a field programmable gate array, an application specific integrated circuit, a graphic processing unit, or combinations thereof.

The processing device 130 can be configured to control some or all of the operations of the row address circuitry 114, the column address circuitry 120, and the precharge circuitry 126. In some instances, the processing device 130 causes the precharge circuitry 126 to precharge the selected column signal lines (bl and blb lines 108, 110) to a first voltage level and the unselected column signal lines to a different second voltage level. In some embodiments, the processing device 130 is operably connected to other components in or operably connected to the memory device, such as, for example, read and write circuitry (not shown) and/or a clock circuit (not shown).

The processing device 130 can be operably connected to one or more storage devices (represented by storage device 132). The storage device 132 can store programs, routines, and/or data that are used for some or all of the operations of the memory device. For example, the storage device 132 can store control signals, or data associated with the control signals, that are used by the row address circuitry 114, the column address circuitry 120, and the precharge circuitry 126. The storage device 132 may comprise, but is not limited to, volatile storage (e.g., random access memory), non-volatile storage (e.g., read-only memory), flash memory, or any combination of such memories.

In some embodiments, optional timing circuitry 134 can be operably connected to the processing device 130. The timing circuitry 134 can be used to limit the amount of time the precharge circuits precharge the unselected column signal lines (bl and blb lines). In this manner, the unselected column signal lines can precharge to a second voltage level that is less than the first voltage level (e.g., VDD). In some embodiments, the operations of the optional timing circuitry 134 may be performed by the processing device 130.

For example, when precharging begins, the timing circuitry 134 can be used to determine the end of a precharge time period for the unselected column signal lines. The processing device 130 may receive a signal from the timing circuitry 134 indicating the end of the precharge time period and responsively cause control signals to be provided to the precharge circuitry 126 that cause the precharging of the unselected column signal lines to end. In some instances, the precharge time period for the unselected column signal lines can be a fraction of the precharge time for the selected column signal lines (e.g., half or three-fourths the precharge time for the selected column signal lines).

Figure 2:
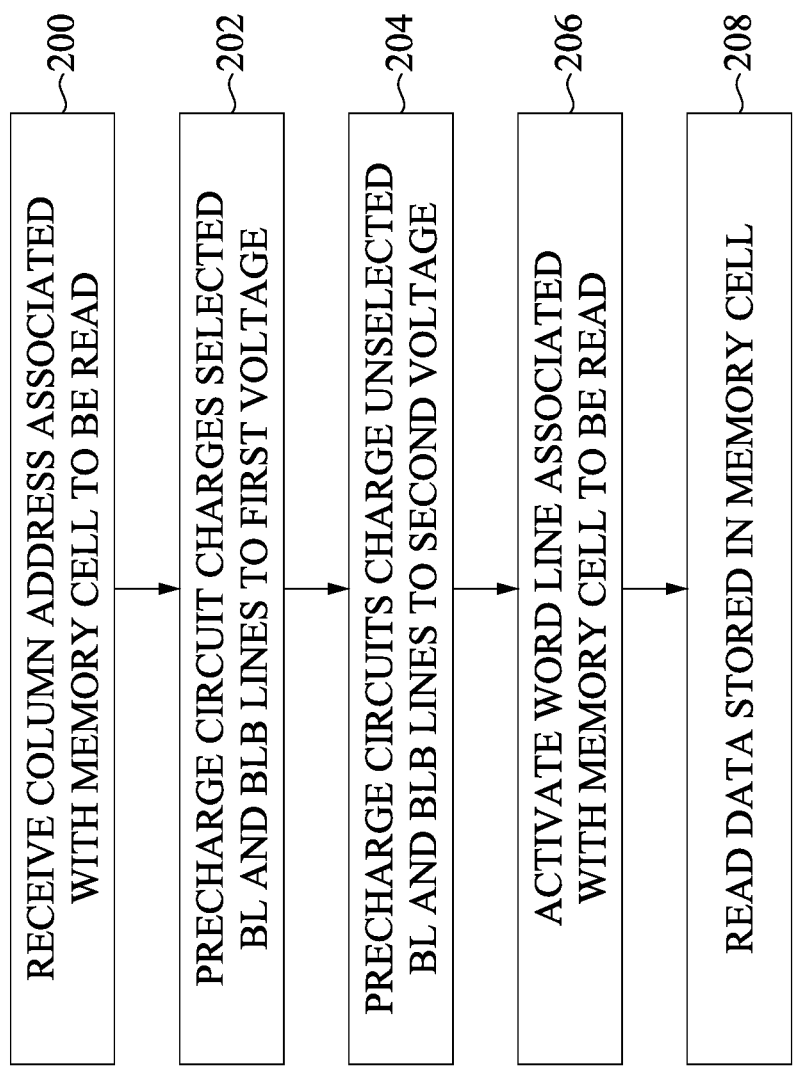
FIG. 2 is a flowchart of a first method of reading data from a memory cell in accordance with some embodiments.

FIG. 2 is a flowchart of a first method of reading data from a memory cell in accordance with some embodiments. FIG. 2 is described in conjunction with reading data in a single memory cell. In other embodiments, the process can be used to read data stored in multiple memory cells.

Initially, as shown in block 200, a column address associated with the memory cell to be read is received. Based on the column address, the bl and blb lines that correspond to the column address are determined (the "selected column signal lines" or the "selected bl and blb lines"). The precharge circuit(s) operably connected to the selected bl and blb lines precharge the selected bl and blb lines to a first voltage (block 202). For example, the selected bl and blb lines may be precharged to VDD.

In an example embodiment, a processing device (e.g., processing device 130 in FIG. 1) can determine, based on the column address, which precharge circuit will be used to precharge the selected bl and blb lines. The column address circuitry (e.g., column address circuitry 120 in FIG. 1) can transmit the column address received on signal line 122 and/or the select signal output on signal line 124 to the processing device. The processing device may then cause one or more control signals to be provided to the precharge circuit to enable the precharge circuit to charge the selected bl and blb lines to the first voltage.

Next, as shown in block 204, the precharge circuits operably connected to the unselected bl and blb lines precharge the unselected bl and blb lines to a second voltage that is less than the first voltage. Again, in a non-limiting embodiment, a processing device can determine, based on the column address, which bl and blb lines are not selected and the precharge circuits operably connected to the unselected bl and blb lines. The processing device may then cause control signals to be provided to those precharge circuits to enable the precharge circuits to charge the unselected bl and blb lines to the second voltage.

After all of the bl and blb lines have been precharged to a respective voltage (e.g., either the first or the second voltage), the word line that is associated with the memory cell to be read is activated (block 206). The data stored in the memory cell is then read from the memory cell at block 208 and output from the memory array to respective output circuitry.

Figure 3:
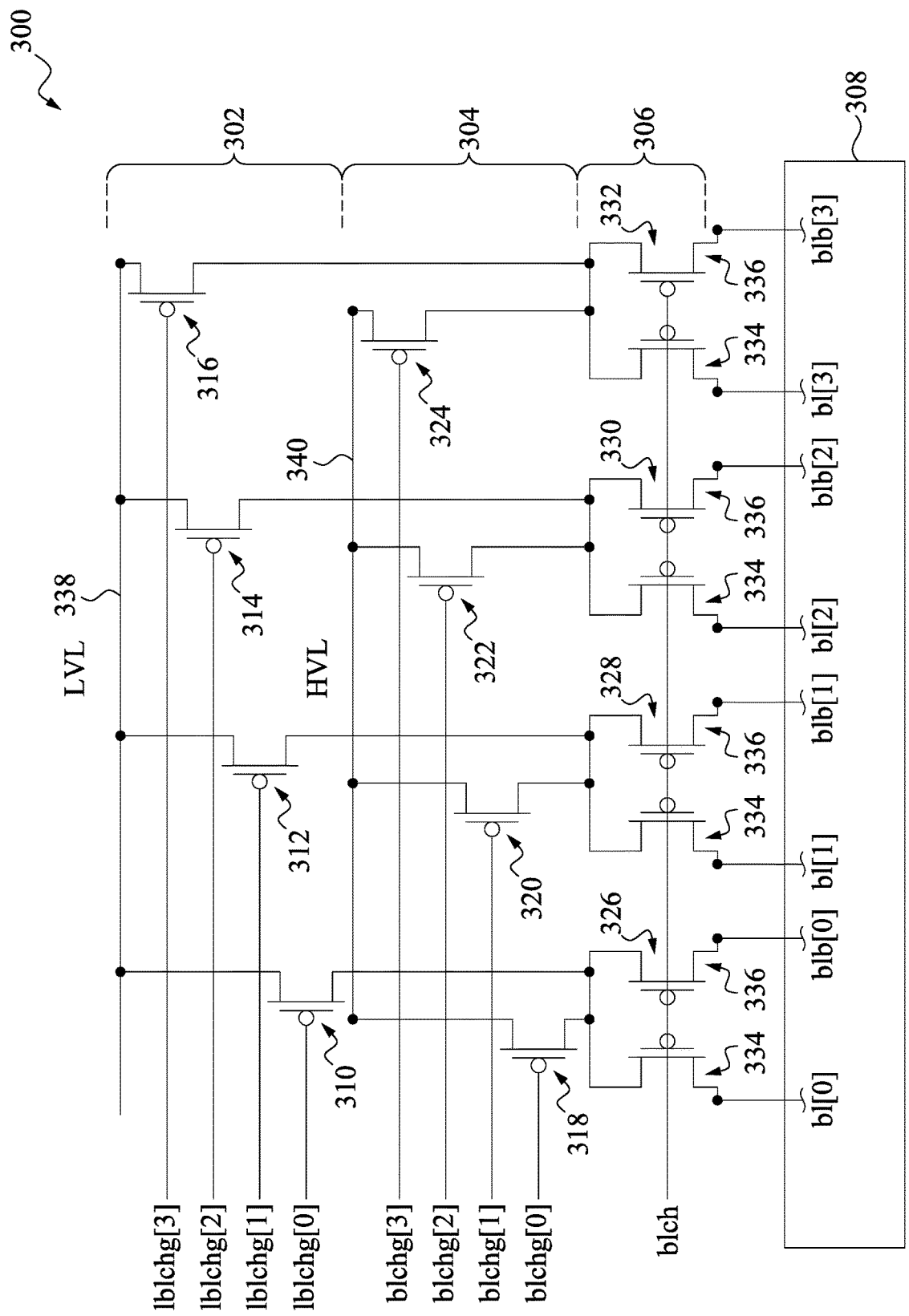
FIG. 3 depicts a schematic of an example first precharge circuitry in accordance with some embodiments.

Several embodiments for precharging the selected and unselected column signal lines (bl and blb lines) are disclosed herein. FIG. 3 depicts a schematic of an example first precharge circuitry in accordance with some embodiments. In one embodiment, the first precharge circuitry 300 is implemented in the precharge circuitry 126 shown in FIG. 1.

In the illustrated embodiment, the precharge circuitry 300 includes first switch circuitry 302 and second switch circuitry 304 operably connected to precharge circuitry 306. The precharge circuits in the precharge circuitry 306 are operably connected to the column signal lines (bl[0]-bl[3] and blb[0]-blb[3] lines) in a memory array 308 (e.g., memory array 104 in FIG. 1). FIG. 3 depicts four column signal lines, although other embodiments are not limited to this implementation. As previously discussed, a memory array can include any number of column signal lines.

Based on the column address(es) for the selected column signal lines, the circuits in the first and second switch circuitries 302, 304 are used to selectively apply one of two voltage levels to the precharge circuits. The switch circuits in the first and the second switch circuitries 302, 304 can be any suitable type of switch circuits. In the illustrated embodiment, the switch circuits in the first switch circuitry 302 are p-type transistors 310, 312, 314, 316 and the switch circuits in the second switch circuitry 304 are p-type transistors 318, 320, 322, 324. One example of a p-type transistor is a PMOS transistor.

Each precharge circuit 326, 328, 330, 332 includes a first p-type transistor 334 and a second p-type transistor 336, where the source terminals are operably connected together, the drain terminal of the first p-type transistor 334 is operably connected to a bl[n] line, and the drain terminal of the second p-type transistor 336 is operably connected to a blb[n] line, where n is a number between zero and three.

Each p-type transistor 310, 312, 314, 316 in the first switch circuitry 302 is operably connected to a particular one of the precharge circuits 326, 328, 330, 332. Similarly, each p-type transistor 318, 320, 322, 324 in the second switch circuitry 304 is operably connected to a particular one of the precharge circuits 326, 328, 330, 332. For example, the drain terminal of the p-type transistor 310 in the first switch circuitry 302 and the drain terminal of the p-type transistor 318 in the second switch circuitry 304 are operably connected to the source terminals of the p-type transistors 334, 336 in the precharge circuit 326.

Each gate terminal of the p-type transistors 310, 312, 314, 316 in the first switch circuitry 302 is operably connected to a first switch control signal lblchg[0], lblchg[1], lblchg[2], lblchg[3]. The first switch control signals lblchg[0], lblchg[1], lblchg[2], lblchg[3] are used to control the states (e.g., on or off) of the p-type transistors 310, 312, 314, 316. Each gate terminal of the p-type transistors 318, 320, 322, 324 in the second switch circuitry 304 is operably connected to a second switch control signal blchg[0], blchg[1], blchg[2], blchg[3]. The second switch control signals blchg[0], blchg[1], blchg[2], blchg[3] are used to control the states (e.g., on or off) of the p-type transistors 318, 320, 322, 324. The gates of the p-type transistors 334, 336 in the precharge circuits 326, 328, 330, 332 are operably connected to a precharge control signal blch. The precharge control signal blch is used to control the states of the precharge circuits (e.g., on or off).

In FIG. 3, the first voltage level on signal line 340 is a high voltage level (HVL) such as VDD and the second voltage level (LVL) on signal line 338 is a voltage level that is lower than the HVL. The first and second switch control signals lblchg[0], lblchg[1], lblchg[2], lblchg[3], blchg[0], blchg[1], blchg[2], blchg[3] and the precharge control signal blch are used to control the precharging of the column signal lines (bl and blb lines) to HVL and LVL. An example timing diagram for precharging bl[0] and [blb[0] lines to HVL and bl[1], blb[1], bl[2], blb[2], bl[3], blb[3] to LVL is shown in FIG. 4.

Figure 4:
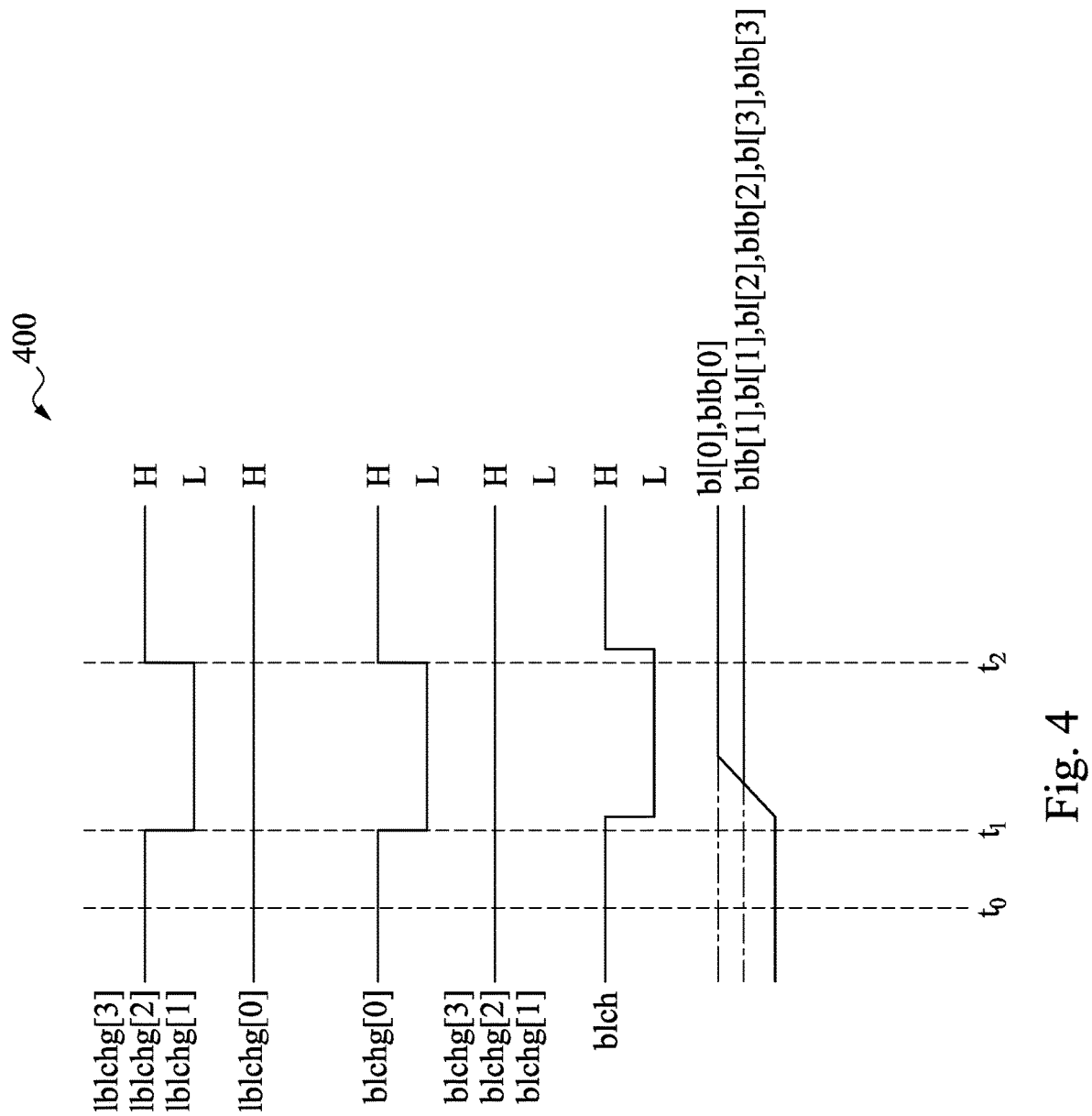
FIG. 4 illustrates an example timing diagram for the first precharge circuitry shown in FIG. 3.

FIG. 4 illustrates an example timing diagram for the first precharge circuitry shown in FIG. 3. In particular, the timing diagram 400 depicts the voltage levels on the first switch control signals lblchg[0], lblchg[1], lblchg[2], lblchg[3], the second switch control signals blchg[0], blchg[1], blchg[2], blchg[3], the precharge control signal blch, and the voltage levels on the column signal lines bl[0], blb[0], bl[1], blb[1], bl[2], blb[2], bl[3], and blb[3]. The timing diagram 400 is used to provide an example embodiment where the bl[0] and blb[0] lines are precharged to the high voltage level and the bl[1], blb[1], bl[2], blb[2], bl[3], and blb[3] lines are precharged to the lower voltage level. In other embodiments, the voltage levels used to precharge the bl[0] and the blb[0] lines can also be used in a similar process to precharge the bl[1], blb[1], bl[2], blb[2], bl[3], and blb[3] lines.

At time t0, the signal levels on the first switch control signals lblchg[0], lblchg[1], lblchg[2], lblchg[3], the second switch control signals blchg[0], blchg[1], blchg[2], blchg[3], and the precharge control signal blch are all at a high voltage level (H). The high voltage level places the p-type transistors 310, 312, 314, 316, 318, 320, 322, 324, 334, 336 in the first and the second switch circuitries 302, 304 and in the precharge circuits 326, 328, 330, 332 to an OFF state. The voltage levels on the column signal lines bl[0], blb[0], bl[1], blb[1], bl[2], blb[2], bl[3], and blb[3] are at a first low voltage level (e.g., ground).

At time $t_1$, the signal levels of the first switch control signals lblchg[1], lblchg[2], lblchg[3] transition to a low voltage level (L) while the signal level on lblchg[0] remains at H. Additionally, the signal levels on the second switch control signals blchg[1], blchg[2], blchg[3] remain at H and the signal levels on switch control signal blchg[0] and the precharge control signal blch transition to L. The low voltage level on the second switch control signal blchg[0] turns on the p-type transistor 318 in the second switch circuitry 304, and the low voltage level on the precharge control signal blch turns on the transistors 334, 336 in the precharge circuits 326, 328, 330, 332. Accordingly, the bl[0] and blb[0] lines are operably connected to the first voltage level HVL on signal line 340 to begin precharging to HVL, and the bl[1], blb[1], bl[2], blb[2], bl[3], and blb[3] lines are operably connected to the second voltage level LVL on signal line 338 to begin precharging to LVL (a second voltage that is less than HVL and greater than the first low voltage at time $t_0$).

During times $t_1$ to $t_2$, the bl[0], blb[0], bl[1], blb[1], bl[2], blb[2], bl[3], and blb[3] lines precharge to respective voltage levels. When precharged, the voltage levels on the bl[0] and blb[0] correspond substantially to HVL on the signal line 340 and the voltage levels on the bl[1], blb[1], bl[2], blb[2], bl[3], and blb[3] lines correspond substantially to LVL on the signal line 338.

At time $t_2$, the signal levels on the first switch control signals lblchg[1], lblchg[2], lblchg[3] transition to H while the signal level on the first control signal lblchg[0] remains at H. Additionally, the signal levels on the second switch control signals blchg[1], blchg[2], blchg[3] remain at H and the signal levels on the second control signal blchg[0] and the precharge control signal blch transition to H. The high signal level on the second switch control signal blchg[0] turns off the p-type transistor 318 in the second switch circuitry 304, and the high signal level on the precharge control signal blch turns off the p-type transistors 334, 336 in the precharge circuits 326, 328, 330, 332. Accordingly, the bl[0] and blb[0] lines are no longer connected to HVL on the signal line 340 and the bl[1], blb[1], bl[2], blb[2], bl[3], and blb[3] lines are no longer connected to LVL on the signal line 338. At time $t_2$, the voltage levels on the bl[0] and blb[0] are precharged substantially to HVL on the signal line 340 and the voltage levels on the bl[1], blb[1], bl[2], blb[2], bl[3], and blb[3] lines are precharged substantially to LVL on the signal line 338.

The embodiments shown in FIGS. 3 and 4 reduce the amount of active power used by a memory array. This is due at least in part to the reduced number of bit lines that are precharged to the HVL. For example, in the representative embodiment of FIG. 3, only a fraction of the eight bit lines bl[n], blb[n] are precharged to the HVL, while the remaining bit lines bl[n], blb[n] are precharged to the LVL. Thus, less power is used during a precharge operation. The phrase "active power" refers to charge that is stored on a battery and used to power the electrical components in an electronic device. Reducing the amount of active power consumed by the memory array increases the amount of time the charge stored on the battery will last before the battery needs to be recharged.

Figure 5:
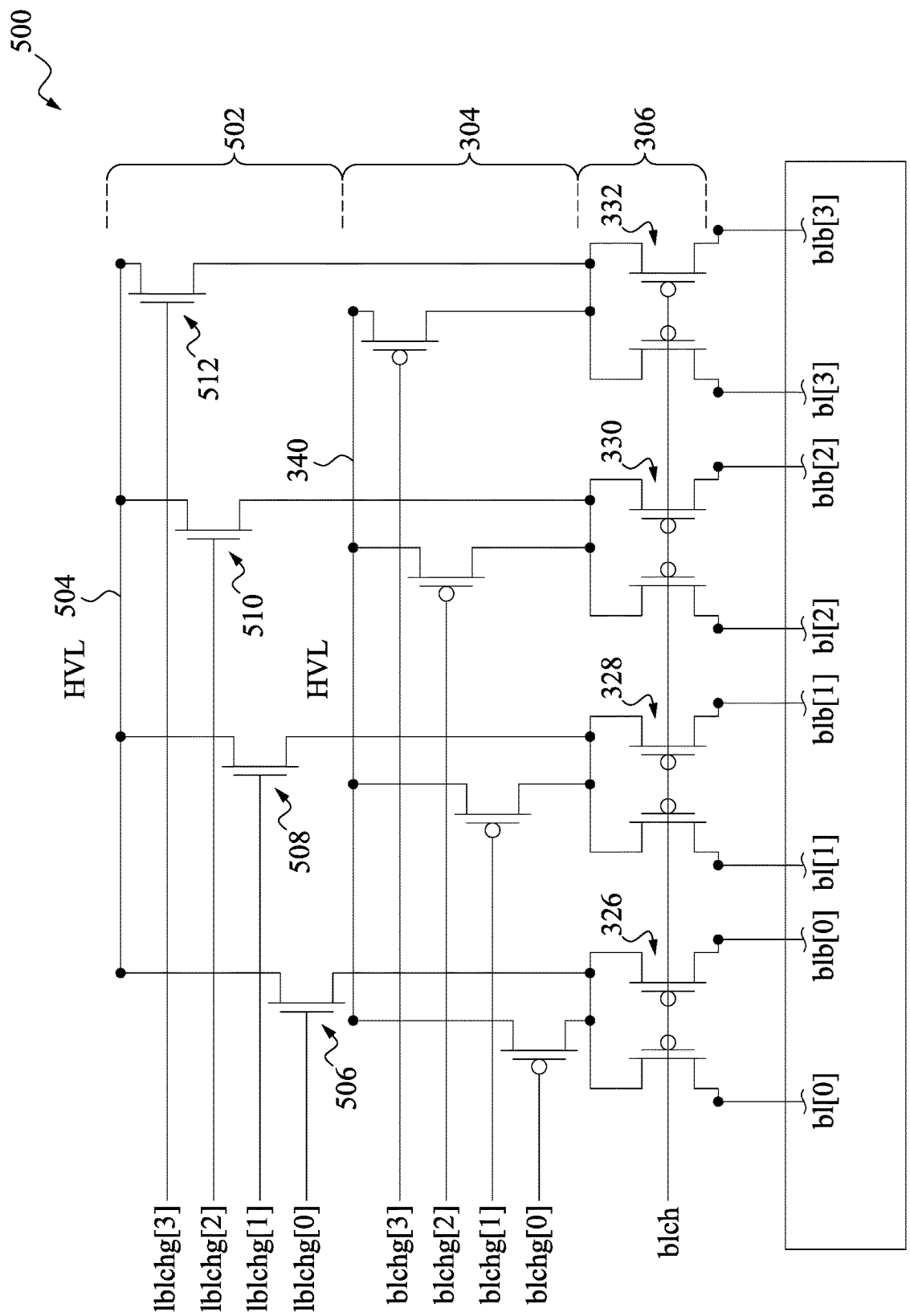
FIG. 5 depicts a schematic of an example second precharge circuitry in accordance with some embodiments.

FIG. 5 depicts a schematic of an example second precharge circuitry in accordance with some embodiments. In one embodiment, the second precharge circuitry 500 is implemented in the precharge circuitry 126 shown in FIG. 1. The second precharge circuitry 500 is similar to the first precharge circuitry 300 in FIG. 3 except for the first switch circuitry 502 and the voltage level on signal line 504. In the illustrated embodiment, the switch circuits in the first switch circuitry 502 are n-type transistors 506, 508, 510, 512 and the voltage level on signal line 504 is the same high voltage level as the high voltage level on signal line 340 (e.g., VDD).

The n-type transistors 506, 508, 510, 512 are used to connect the unselected column signal lines (bl and blb lines) to signal line 504. When the signal levels on the first switch control signals lblchg[0], lblchg[1], lblchg[2], lblchg[3], and the precharge control signal blch turn on the n-type transistors 506, 508, 510, 512 and the precharge circuits 326, 328, 330, 332, respectively, the unselected column signal lines will precharge to the $V_t$ drop associated with the n-type transistors 506, 508, 510, 512, a voltage level that is less than HVL.

One advantage to the second precharge circuitry 500 is the elimination of a signal line that is operably connected to an external low voltage power source (e.g., for a low voltage level). However, in other embodiments, the voltage level on signal line 504 can be a low voltage level (LVL). The LVL can be derived from the HVL (see e.g., transistor 902 in FIG. 9), or the LVL can be obtained by connecting the signal line 504 to a low voltage power supply.

Figure 6:
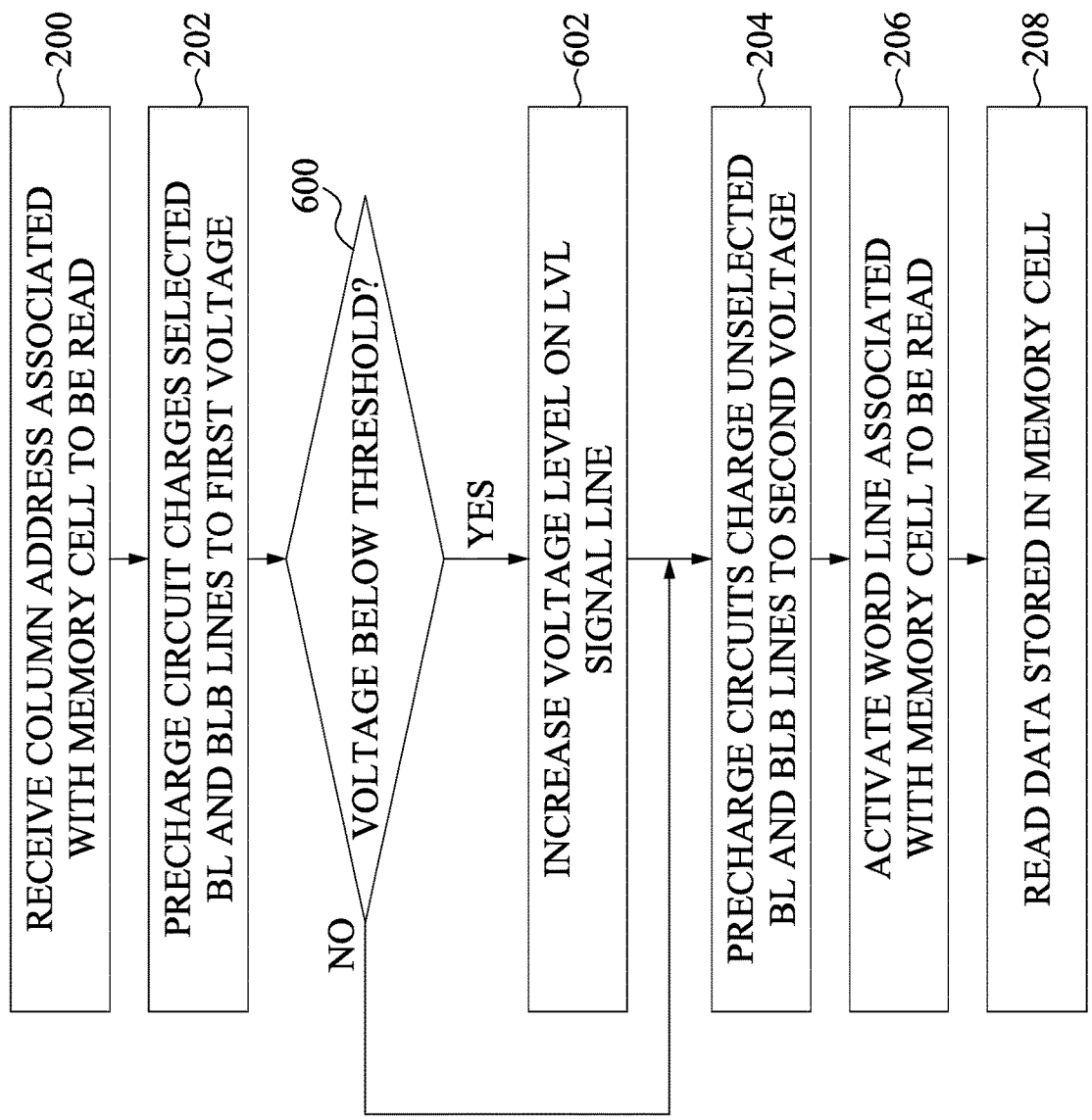
FIG. 6 is a flowchart of a second method of reading data from a memory cell in accordance with some embodiments.

FIG. 6 is a flowchart of a second method of reading data from a memory cell in accordance with some embodiments. The process shown in FIG. 6 is similar to the method depicted in FIG. 2 except for blocks 600 and 602. Like FIG. 2, FIG. 6 is described in conjunction with reading data in a single memory cell. In other embodiments, the process can be used to read data stored in multiple memory cells.

Initially, as shown in block 200, a column address associated with the memory cell to be read is received. Based on the column address, the bl and blb lines that correspond to the column address are determined and the precharge circuit operably connected to the selected bl and blb lines precharge the selected bl and blb lines to a first voltage (block 202). For example, the selected bl and blb lines may be precharged to VDD.

A determination is made at block 600 as to whether the second voltage level on a low voltage (LVL) signal line is less than a threshold voltage. In one embodiment, the threshold voltage is between the HVL and a voltage level that is less than HVL while maintaining the stability of the memory cells. When the voltage level on the LVL signal line is less than the threshold voltage, the process continues at block 602 where the voltage level on the LVL signal line is increased to a voltage level that is greater than the threshold voltage. Any suitable technique can be used to increase the voltage level. Example embodiments to increase the voltage level are described in more detail in conjunction with FIGS. 7-9.

When the voltage level on the LVL signal line is greater than the threshold voltage at block 600, or when the voltage level on the LVL signal line is increased to be above the threshold voltage (block 602), the method passes to block 204 where the precharge circuits operably connected to the unselected bl and blb lines precharge the unselected bl and blb lines to the second voltage level.

After all of the bl and blb lines have been precharged to a respective voltage level, the word line that is associated with the memory cell to be read is activated (block 206). The data stored in the memory cell is then read from the memory cell at block 208 and output from the memory array to respective output circuitry.

Although the blocks shown in FIGS. 2 and 6 are shown in a particular order, in other embodiments the order of the blocks can be arranged differently or new blocks may be added. For example, block 202 can be performed after block 204.

Figure 7:
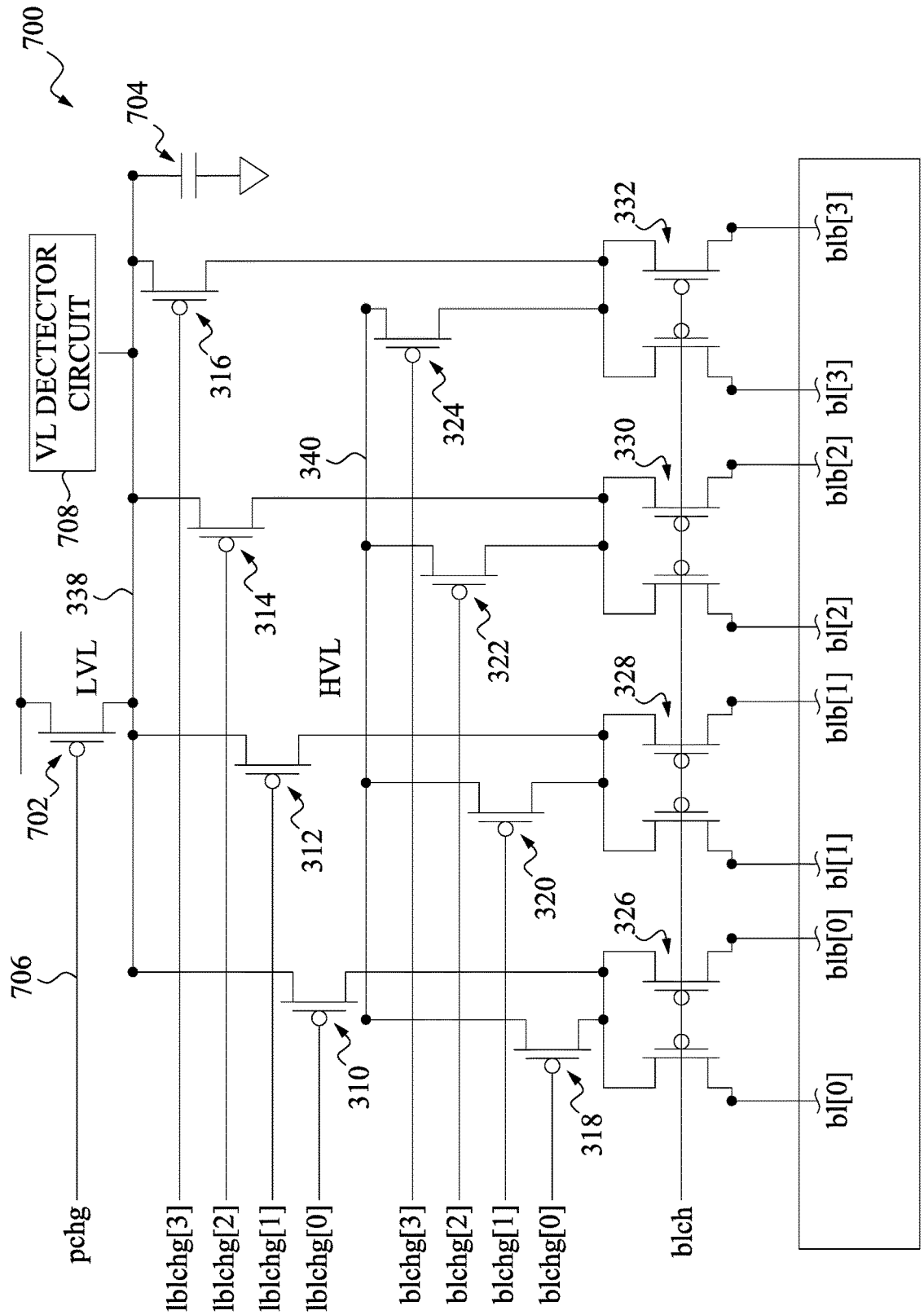
FIG. 7 depicts a schematic of an example third precharge circuitry in accordance with some embodiments.

FIG. 7 illustrates a schematic of an example third precharge circuitry in accordance with some embodiments. In one embodiment, the third precharge circuitry 700 is implemented in the precharge circuitry 126 shown in FIG. 1. Instead of having a low voltage signal line in the precharge circuitry that is connected to a power supply outside of the precharge circuitry, charge can be stored in a charge storage device that is connected to the signal line 338 and used to precharge column signal lines (bl and blb lines).

In FIG. 7, the precharge circuitry 700 is similar to the precharge circuitry 300 illustrated in FIG. 3 except for a low voltage (LV) switch circuit and a charge storage device, both of which are operably connected to the signal line 338. Any suitable LV switch circuit and charge storage device can be used. In the illustrated embodiment, the LV switch circuit is a p-type transistor 702 (e.g., a PMOS transistor) and the charge storage device is a capacitor 704.

The drain terminal of the p-type transistor 702 is operably connected to the signal line 338 and the gate of the p-type transistor 702 is operably connected to the signal line 706. The signal line 706 is used to apply a signal to the p-type transistor 702 to turn the p-type transistor 702 on and off. When turned on, the p-type transistor 702 charges the signal line 338 to a voltage level that is less than HVL on signal line 340 and higher than a threshold voltage. While the signal line 338 is charged, the capacitor 704 stores charge or voltage that will be used to precharge the unselected column signal lines (bl and blb signal lines) to the second voltage level LVL. Once the signal line 338 is charged to the second voltage level (LVL), the p-type transistor 702 is turned off. The voltage stored in the capacitor 704 can be shared between all of the unselected column signal lines. For example, when bl[0], blb[0], bl[1], blb[1], bl[2], and blb[2] will be precharged to the second voltage level LVL, the transistors 310, 312, 314 are turned on and share the voltage stored on the capacitor 704.

A voltage level detector circuit 708 is operably connected to the signal line 338. The voltage level detector circuit 708 may also be operably connected to a processing device (e.g., processing device 130 in FIG. 1). In one embodiment, the voltage level detector circuit 708 is disposed within the precharge circuitry (e.g., precharge circuitry 126 in FIG. 1), although other embodiments are not limited to the configuration. As the column signal lines (bl and blb lines) are precharged, the voltage level detector circuit 708 monitors the voltage level on the signal line 338 by continuously, periodically or at select times measuring the voltage level on the signal line 338. The processing device (e.g., processing device 130 in FIG. 1) receives the voltage measurements from the voltage level detector circuit 708. When the voltage level is below the threshold voltage, the processing device (e.g., processing device 130 in FIG. 1) causes a signal (pchg) to be applied to the signal line 706 to turn on the p-type transistor 702 and increase the voltage level on the signal line 338 and stored in the capacitor 704.

Figure 8:
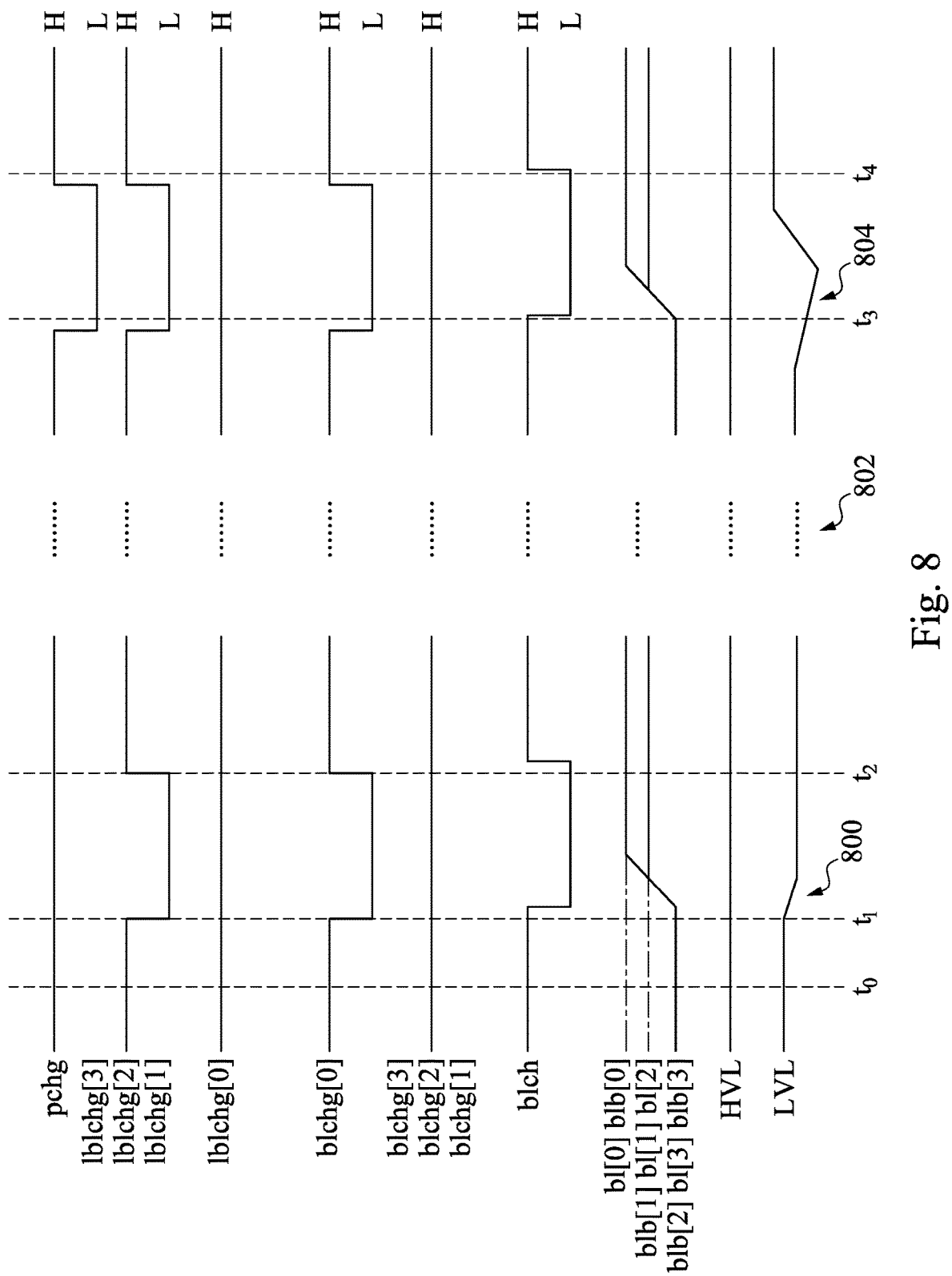
FIG. 8 illustrates an example timing diagram for the third precharge circuitry shown in FIG. 7.

FIG. 8 illustrates an example timing diagram for the third precharge circuitry shown in FIG. 7. At time t0, the voltage level on signal line 338 is charged fully to the LVL level and the p-type transistor 702 and the p-type transistors 310, 312, 314, 316, 318, 320, 322, 324 are all turned off (e.g., first and second switch control signals blchg[0], lblchg[0], blchg[1], lblchg[1], blchg[2], lblchg[2], blchg[3], lblchg[3], and signal pchg are all high). Additionally, the voltage levels on the column signal lines bl[0], blb[0], bl[1], blb[1], bl[2], blb[2], bl[3], blb[3] are at a first low voltage level (e.g., ground).

At time $t_1$, the signal levels on the second switch control signal blchg[0] and the first switch control signals lblchg[1], lblchg[2], lblchg[3] all transition to low to turn on p-type transistors 312, 314, 316, 318. The precharge control signal blch also transitions low to turn on the precharge circuits 326, 328, 330, 332, which causes the column signal lines bl[0], blb[0], bl[1], bl[2], blb[2], bl[3], blb[3] to begin precharging. Since the transistor 318 is turned on, the precharge circuit 326 precharges the column signal lines bl[0], blb[0] to the first voltage level HVL on signal line 340. Additionally, since the transistors 312, 314, 316 are turned on, the precharge circuits 328, 330, 332 precharge the column signal lines bl[1], blb[1], bl[2], blb[2], bl[3], blb[3] to the second voltage level LVL on signal line 338.

While the column signal lines bl[1], blb[1], bl[2], blb[2], bl[3], blb[3] precharge, the voltage level on signal line 338 (and stored by the capacitor 704) is used to precharge the column signal lines bl[1], blb[1], bl[2], blb[2], bl[3], blb[3]. During the precharge operation, the voltage level on signal line 338 decreases, as shown at 800. At time $t_2$, the column signal lines bl[0], blb[0] are precharged substantially to the first voltage level HVL and the column signal lines bl[1], blb[1], bl[2], blb[2], bl[3], blb[3] are precharged substantially to the second voltage level LVL. Accordingly, the signal levels on the second switch control signal blchg[0] and the first switch control signals lblchg[1], lblchg[2], lblchg[3] all transition back to high to turn off p-type transistors 312, 314, 316, 318. The precharge control signal blch also transitions high to turn off the precharge circuits 326, 328, 330, 332.

Sometime later (indicated by ellipses 802), at time $t_3$, the column signal lines are to be precharged again with bl[0] and blb[0] precharging to the first voltage level HVL on signal line 340 and bl[1], blb[1], bl[2], blb[2], bl[3], blb[3] precharging to the second voltage level LVL on signal line 338. The signal levels on the second switch control signal blchg[0] and the first switch control signals lblchg[1], lblchg[2], lblchg[3] all transition to low to turn on transistors 312, 314, 316, 318. The precharge control signal blch also transitions low to turn on the precharge circuits 326, 328, 330, 332, which causes the column signal lines bl[0], blb[0], bl[1], blb[1], bl[2], blb[2], bl[3], blb[3] to begin precharging. Due to the previous precharge operation, or one or more additional precharge operations that were performed prior to time $t_3$, the voltage level on signal line 338 has decreased below a threshold value at 804 (as measured by the voltage level detector circuit 708 in FIG. 7). Accordingly, the signal pchg transitions low to turn on the p-type transistor 702 and recharge the voltage level on signal line 338 (and stored in capacitor 704).

At time $t_4$, the column signal lines bl[0], blb[0] are precharged substantially to the first voltage level HVL and the column signal lines bl[1], blb[1], bl[2], blb[2], bl[3], blb[3] are precharged substantially to the second voltage level LVL. Accordingly, the signal levels on the second switch control signal blchg[0] and the first switch control signals lblchg[1], lblchg[2], lblchg[3] all transition high to turn off transistors 312, 314, 316, 318. The precharge control signal blch also transitions high to turn off the precharge circuits 326, 328, 330, 332. Additionally, the voltage level on signal line 338 (and stored by capacitor 704) is charged substantially to the second voltage level LVL so the pchg signal on signal line 706 transitions high to turn off the p-type transistor 702.

The embodiments shown in FIGS. 7 and 8 enable unused charge on the bit lines bl[n], blb[n] to be "reused" in that the unused charge is stored in the charge storage device (e.g., the capacitor 704) and applied to the signal line 338 during precharge operations. In this manner, less active power is used when the unselected bit lines are precharged.

Figure 9:
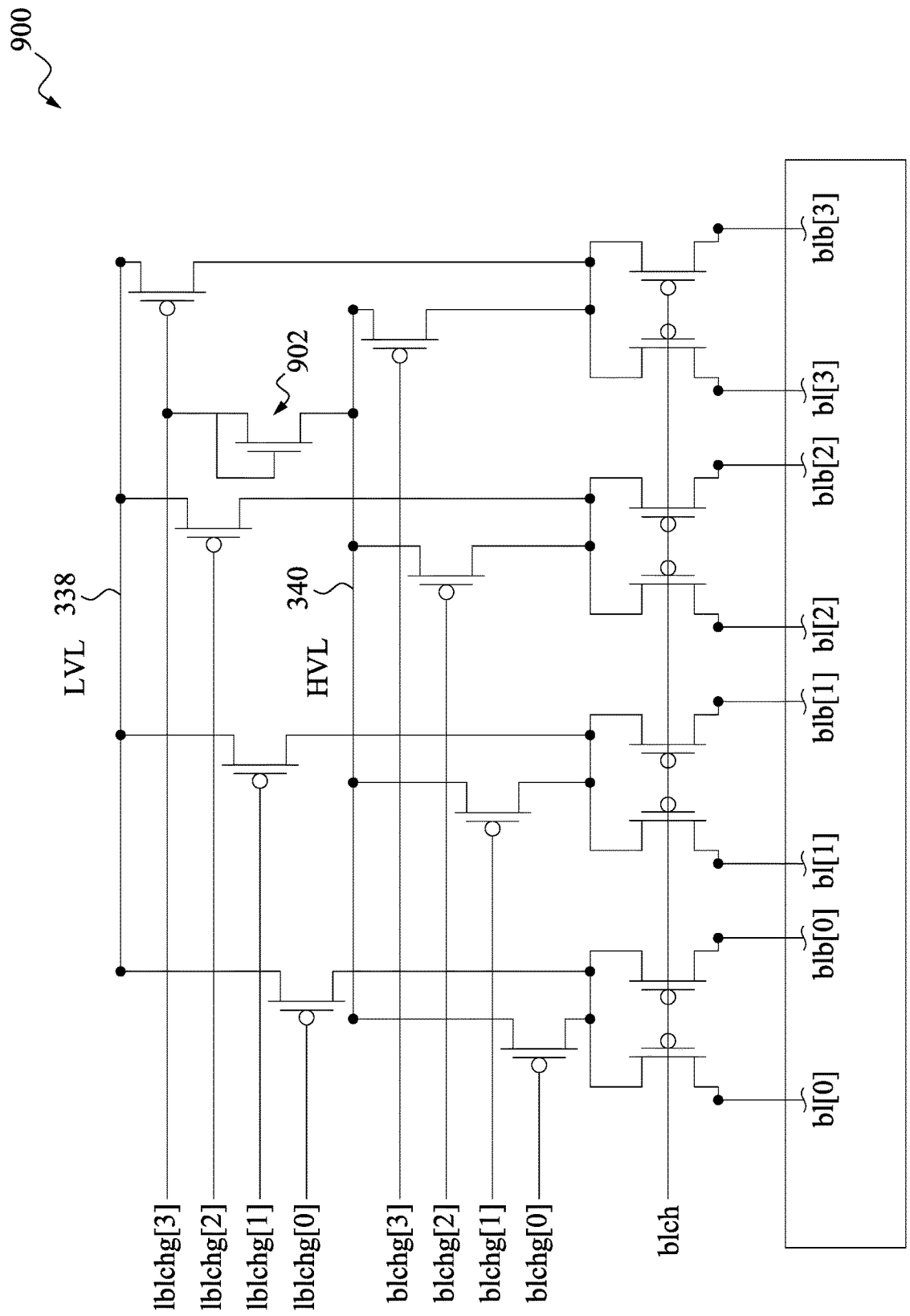
FIG. 9 illustrates a schematic of an example fourth precharge circuitry in accordance with some embodiments.

FIG. 9 illustrates a schematic of an example fourth precharge circuitry in accordance with some embodiments. The fourth precharge circuitry 900 is similar to the precharge circuitry 300 illustrated in FIG. 3 except for a voltage level detector circuit operably connected to the signal line 338. Any suitable voltage level detector circuit can be used. In the illustrated embodiment, the voltage level detector circuit is an n-type transistor 902 with the drain and gate operably connected to the signal line 338 and the source operably connected to the signal line 340.

The n-type transistor 902 is used to detect when the voltage level on the signal line 338 drops below a threshold voltage. In the illustrated embodiment, the threshold voltage is the diode drop or Vt drop associated with the n-type transistor 902. When the voltage level drops below the threshold voltage, charge or voltage will transfer from the signal line 340 to the signal line 338 until the voltage is equal to or greater than the threshold voltage. The transfer stops once the voltage on signal line 338 is equal to or greater than the threshold voltage. In this manner, the amount of active power that is consumed during a precharge operation is reduced because charge on the HVL 340 is provided to the LVL 338.

In some embodiments, a LV switch circuit (see 702 in FIG. 7) may be operably connected to the signal line 338 in addition to the n-type transistor 902. The LV switch circuit can assist in charging the signal line 338. For example, if the operation of the voltage level detector circuit degrades over time, the LV switch circuit can be used in place of, or in addition to, the voltage level detector circuit.

Figure 10:
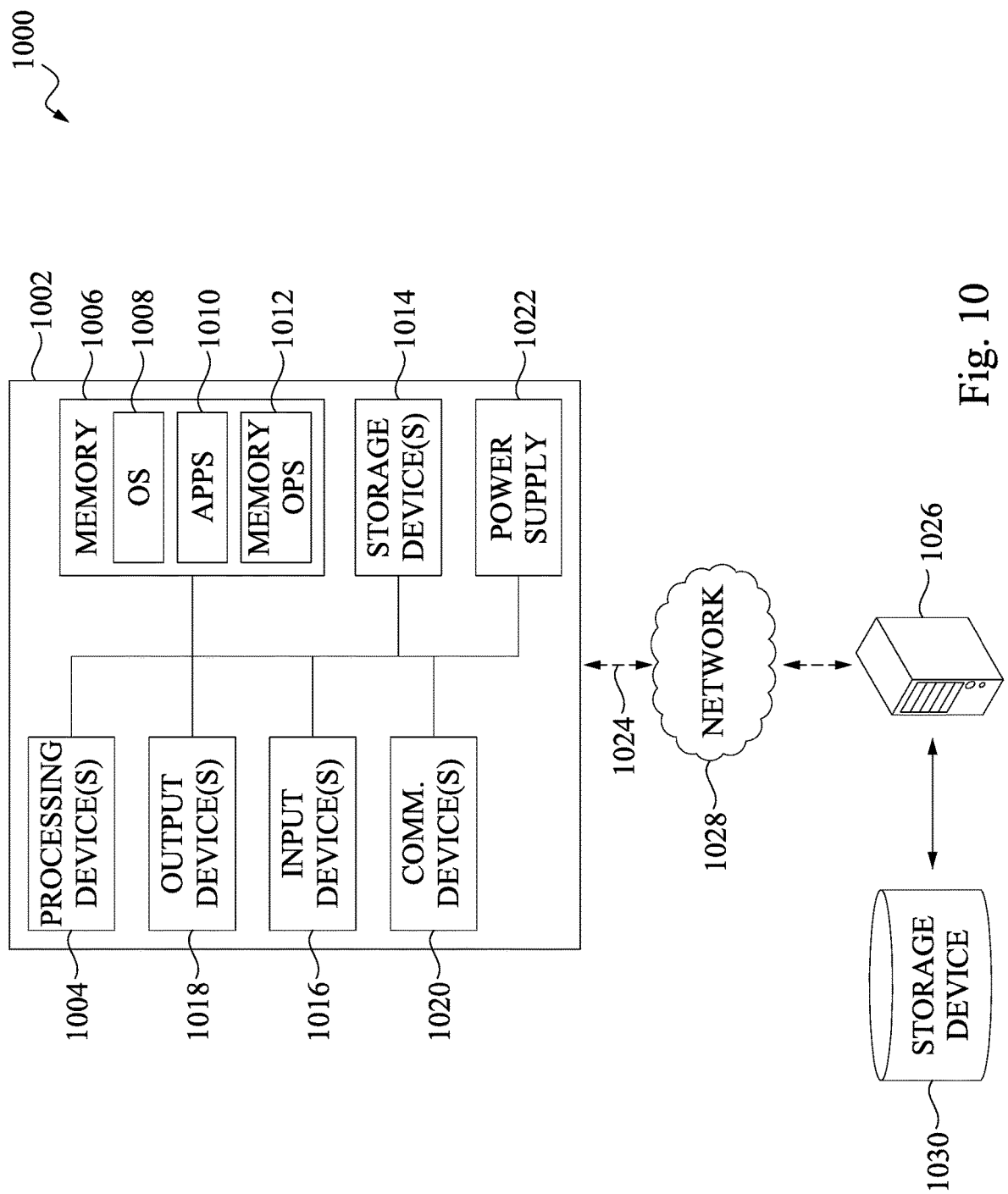
FIG. 10 depicts an example system that can include one or more memory devices in accordance with some embodiments in accordance with some embodiments.

FIG. 10 depicts an example system that can include one or more memory devices in accordance with some embodiments. The system 1000 includes an electronic device 1002. In a basic configuration, the electronic device 1002 may include at least one processing device 1004 and a system memory device 1006. The system memory device 1006 may include a number of data files and executable instructions of program modules, such as executable instructions associated with an operating system (OS) 1008, one or more software programs (APPS) 1010 suitable for parsing received input, determining subject matter of received input, determining actions associated with the input and so on, and memory operations 1012 for performing some or all of the memory operations disclosed herein. When executed by the processing device(s) 1004, the executable instructions may perform and/or cause to be performed processes including, but not limited to, the aspects as described herein.

The OS 1008, for example, may be suitable for controlling the operation of the electronic device 1002. Furthermore, embodiments may be practiced in conjunction with a graphics library, other operating systems, or any other application program and is not limited to any particular application or system.

The electronic device 1002 may have additional features or functionality. For example, the electronic device 1002 may also include additional removable and/or non-removable data storage devices 1014 such as, for example, magnetic disks, optical disks, tape, and/or memory cards or sticks. The system memory device 1006 and/or the data storage device 1014 may be implemented as a memory device that precharges signal lines and selects a subset of the precharged signal lines to perform an operation (e.g., to access a memory cell or cells). For example, the system memory device 1006 and/or the data storage device 1014 can be an SRAM device.

The electronic device 1002 may also have one or more input devices 1016 and one or more output devices 1018. Example input device(s) 1016 include, but are not limited to, a keyboard, a trackpad, a mouse, a pen, a sound or voice input device, and/or a touch, force and/or swipe input device. The output device(s) 1018 can be one or more displays, one or more speakers, a printer, headphones, haptic or tactile feedback device, and the like. The electronic device 1002 may include one or more communication devices 1020 allowing communications with other electronic devices. Examples communication devices 1020 include, but are not limited to, radio frequency (RF) transmitter, receiver, and/or transceiver circuitry (e.g., WiFi), universal serial bus (USB), parallel and/or serial ports, cellular devices, near field communication devices, and short range wireless devices.

The electronic device 1002 further includes a power supply 1022 in some embodiments, which may be implemented as an external power source, such as an AC adapter. Additionally or alternatively, the power supply 1022 may include one or more batteries or a powered docking cradle that supplements or recharges the batteries.

The system memory 1006 and the storage device(s) 1014 may include, but is not limited to, volatile storage (e.g., random access memory), non-volatile storage (e.g., read-only memory), flash memory, or any combination of such memories. For example, the system memory 1006 and the storage device(s) 1014 can each be RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the electronic device 1002. In some instances, any such memory or storage device may be part of the electronic device 1002 or operably connected to the electronic device 1002.

Furthermore, embodiments may be practiced in an electrical circuit comprising discrete electronic elements, packaged or integrated electronic chips containing logic gates, a circuit utilizing a microprocessor, or on a single chip containing electronic elements or microprocessors. For example, embodiments of the disclosure may be practiced via a system-on-a-chip (SOC) where each or many of the components illustrated in FIG. 10 may be integrated onto a single integrated circuit. Such an SOC device may include one or more processing devices, graphics units, communications units, system virtualization units and various application functionality all of which are integrated (or "burned") onto the chip substrate as a single integrated circuit.

When operating via an SOC, the functionality, described herein, with respect to memory operations, may be operated via application-specific logic integrated with other components of the electronic device 1002 on the single integrated circuit (chip). Embodiments of the disclosure may also be practiced using other technologies capable of performing logical operations such as, for example, AND, OR, and NOT, including but not limited to mechanical, optical, fluidic, and quantum technologies. In addition, embodiments may be practiced within a general purpose computer or in any other circuits or systems.

In some embodiments, the electronic device 1002 optionally accesses (optional connection and access indicated by dashed line 1024) one or more server-computing devices (represented by server-computing device 1026) through a wired and/or wireless connection to one or more networks (represented by network 1028). The server-computing device 1026 can interact with various programs or services stored on one or more storage devices (represented by storage device 1030) and executed by the server-computing device 1026.

In one or more embodiments, the network 1028 is illustrative of any type of network, for example, an intranet and/or a distributed computing network (e.g., the Internet). The electronic device 1002 can be a personal or handheld computing device or a desktop computing device. For example, the electronic device 1002 may be a smart phone, a tablet, a wearable device, a desktop computer, a laptop computer, and/or a server (individually or in combination). This list of electronic devices is for example purposes only and should not be considered as limiting. Any electronic device that provides and/or interacts with one or more modeling programs or services may be utilized.

Although the figures depict certain components, values, and signal levels, other embodiments are not limited to these components, values, and signal levels. For example, FIG. 3 depicts the switch circuits in the first and second switch circuitries as p-type transistors. Other embodiments can use a different type or types of switch circuits. In another example, FIG. 9 depicts an n-type transistor as a voltage level detector circuit. Other embodiments can use a different type of voltage level detector circuit.

In one aspect, an electronic device includes a memory device and a processing device. The memory device includes a first memory cell operably connected to one or more first column signal lines, a second memory cell operably connected to one or more second column signal lines, and precharge circuitry operably connected to the first and the second column signal lines. The processing device is operably connected to the precharge circuitry. A storage device is operably connected to the processing device and stores instructions, that when executed by the processing device, cause the precharge circuitry to precharge the one or more first column signal lines to a first voltage level when the first memory cell is to be accessed and precharge the one or more second column signal lines to a lower second voltage level when the first memory cell is to be accessed.

In another aspect, a method of precharging column signal lines that are operably connected to memory cells in a memory array includes determining one or more selected column signal lines operably connected to a memory cell to be accessed based on a received column address associated with the memory cell. The one or more selected column signal lines are precharged to a first voltage level and the one or more unselected column signal lines are precharged to a second voltage level that is less than the first voltage level.

In yet another aspect, a memory device includes a first memory cell operably connected to one or more first column signal lines and a second memory cell operably connected to one or more second column signal lines. A first precharge circuit is operably connected to the one or more first column signal lines and a second precharge circuit is operably connected to the one or more second column signal lines. A first switch circuit is operably connected between the first precharge circuit and a first signal line providing a first voltage level and a second switch circuit is operably connected between the second precharge circuit and the first signal line providing the first voltage level. A third switch circuit is operably connected between the first precharge circuit and a second signal line providing a second voltage level and a fourth switch circuit is operably connected between the second precharge circuit and the second signal line providing the second voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   a memory device, comprising:
      a first memory cell operably connected to one or more first column signal lines;
      a second memory cell operably connected to one or more second column signal lines;
      precharge circuitry operably connected to the one or more first and the one or more second column signal lines, wherein:
         the precharge circuitry is operable to:
            precharge the one or more first column signal lines from a first voltage level to a second voltage level when the first memory cell is to be accessed;
            precharge the one or more second column signal lines from the first voltage level to a third voltage level when the first memory cell is to be accessed, wherein the third voltage level is less than the second voltage level and greater than the first voltage level; and
         the precharge circuitry comprises:
            a first precharge circuit operably connected to the one or more first column signal lines;
            a second precharge circuit operably connected to the one or more second column signal lines;
            a first switch circuit operably connected between the first precharge circuit and a first signal line providing the second voltage level;
            a second switch circuit operably connected between the second precharge circuit and the first signal line providing the second voltage level;
            a third switch circuit operably connected between the first precharge circuit and a second signal line providing the third voltage level;
            a fourth switch circuit operably connected between the second precharge circuit and the second signal line providing the third voltage level; and
            a voltage level detector operably connected between the first signal line and the second signal line.

2. The electronic device of claim 1, wherein the one or more first column signal lines and the one or more second column signal lines each comprise a bit line and a bit line bar.

3. The electronic device of claim 1, wherein the first switch circuit, the second switch circuit, the third switch circuit, and the fourth switch circuit each comprise a p-type transistor.

4. The electronic device of claim 1, wherein:
the first switch circuit and the second switch circuit each comprise a p-type transistor; and
the third switch circuit and the fourth switch circuit each comprise an n-type transistor.

5. The electronic device of claim 1, wherein:
the voltage level detector comprises a first voltage level detector; and
the electronic device further comprises:
a second voltage level detector operably connected to the second signal line; and
a fifth switch circuit operably connected to the second signal line.

6. The electronic device of claim 1, further comprising timing circuitry operably connected to the precharge circuitry.

7. A method of precharging column signal lines operably connected to memory cells in a memory array, the method comprising:
based on a received column address associated with a memory cell to be accessed, determining one or more selected column signal lines operably connected to the memory cell;
precharging the one or more selected column signal lines from a first voltage level to a second voltage level;
precharging one or more unselected column signal lines from the first voltage level to a third voltage level that is less than the second voltage level and greater than the first voltage level;
while the one or more unselected column signal lines are precharging to the third voltage level, determining a voltage level on a signal line providing the third voltage level is below a threshold voltage; and
causing the voltage level on the signal line to be recharged to a level that is greater than the threshold voltage.

8. The method of claim 7, wherein precharging the one or more unselected column signal lines to the third voltage comprises precharging the one or more unselected column signal lines for a first amount of time to precharge the one or more unselected column signal lines to the third voltage, where the first amount of time is less than a second amount of time to precharge the one or more selected column signal lines.

9. The method of claim 7, wherein the third voltage level is provided using the second voltage level.

10. The method of claim 7, wherein:
the signal line comprises a first signal line;
precharging the one or more selected column signal lines to the second voltage level comprises operably connecting the one or more selected column signal lines to a second signal line providing the second voltage level using one or more first switch circuits; and
precharging the one or more unselected column signal lines to the third voltage level comprises operably connecting the one or more unselected column signal lines to the first signal line providing the third voltage level using one or more second switch circuits.

11. A memory device, comprising:
a first memory cell operably connected to one or more first column signal lines;
a second memory cell operably connected to one or more second column signal lines;
a first precharge circuit operably connected to the one or more first column signal lines;
a second precharge circuit operably connected to the one or more second column signal lines;
a first switch circuit operably connected between the first precharge circuit and a first signal line providing a first voltage level that is greater than a low voltage level;
a second switch circuit operably connected between the second precharge circuit and the first signal line providing the first voltage level;
a third switch circuit operably connected between the first precharge circuit and a second signal line providing a second voltage level that is greater than the low voltage level and less than the first voltage level;
a fourth switch circuit operably connected between the second precharge circuit and the second signal line providing the second voltage level; and
a voltage level detector operably connected between the first signal line and the second signal line.

12. The memory device of claim 11, wherein the first switch circuit, the second switch circuit, the third switch circuit, and the fourth switch circuit each comprise a p-type transistor.

13. The memory device of claim 11, wherein:
the first switch circuit and the second switch circuit each comprise a p-type transistor; and
the third switch circuit and the fourth switch circuit each comprise an n-type transistor.

14. The memory device of claim 11, wherein:
the voltage level detector comprises a first voltage level detector; and
the memory device further comprises:
a second voltage level detector operably connected to the second signal line; and
a fifth switch circuit operably connected to the second signal line.

15. The memory device of claim 11, wherein the memory device comprises a static random access memory device.

16. The electronic device of claim 1, wherein the voltage level detector comprises a transistor.

17. The method of claim 7, further comprising:
prior to precharging the one or more unselected column signal lines from the first voltage level to the third voltage level, determining the voltage level on the signal line providing the third voltage level is less than a threshold voltage; and
causing the voltage level on the signal line to recharge to a level that is greater than the threshold voltage.

18. The method of claim 7, further comprising after the one or more selected column signal lines are precharged to the second voltage level and the one or more unselected column signal lines are precharged to the third voltage level, activating a word line associated with the memory cell to be accessed and accessing the memory cell.

19. The method of claim 18, wherein accessing the memory cell comprises reading data stored in the memory cell.

20. The memory device of claim 11, wherein the voltage level detector comprises a transistor.

* * * * *